(12) United States Patent
Sosnowski

(10) Patent No.: US 6,225,555 B1
(45) Date of Patent: May 1, 2001

(54) SHIELDING STRIP

(75) Inventor: Anthony Michael Sosnowski, Stroudsburg, PA (US)

(73) Assignee: Instrument Specialties Company, Inc., Delaware Water Gap, PA (US)

( * ) Notice: Subject to any disclaimer, the term of this patent is extended or adjusted under 35 U.S.C. 154(b) by 0 days.

(21) Appl. No.: 09/115,508

(22) Filed: Jul. 15, 1998

(51) Int. Cl.[7] ........................................ H05K 9/00
(52) U.S. Cl. ........................................ 174/35 GC
(58) Field of Search .................... 174/35 GC, 35 R; 361/816, 818, 800; 277/920, 925

(56) References Cited

U.S. PATENT DOCUMENTS

| | | | |
|---|---|---|---|
| 5,004,866 | * | 4/1991 | Cooke et al. ............... 174/35 GC |
| 5,204,496 | * | 4/1993 | Boulay et al. .............. 174/35 GC |
| 5,250,751 | * | 10/1993 | Yamaguchi ................ 174/35 GC |
| 5,404,276 | * | 4/1995 | Hansson et al. ............... 361/821 |
| 5,569,877 | * | 10/1996 | Yumi ........................ 174/35 GC |

OTHER PUBLICATIONS

Instrument Specialties Catalog, "RF Shielding Selection: A Guide to Interference Control," CAT–91, 1991.
BrushWellman Engineering Materials Brochure, "Guide to Beryllium Copper," pp. 4 and 10, Apr. 1992.
Instrument Specialties Catalog, "Engineering Design and Shielding Product Selection Guide," pp. 62, 64 and 65, Apr. 1998.
Instrument Specialties Catalog, "Product Design and Shielding Selection Guide," pp. 59–66, Sep. 1994.

\* cited by examiner

*Primary Examiner*—Dean A. Reichard
*Assistant Examiner*—Hung V Ngo
(74) *Attorney, Agent, or Firm*—Burns Doane Swecker & Mathis L.L.P.

(57) ABSTRACT

A shielding strip is provided with a snap lock to secure the strip to a mounting surface. The snap lock includes two legs which extend from the strip through a hole in the mounting surface, and include portions which extend past the edge of the hole to lock the strip onto the mounting surface.

16 Claims, 4 Drawing Sheets

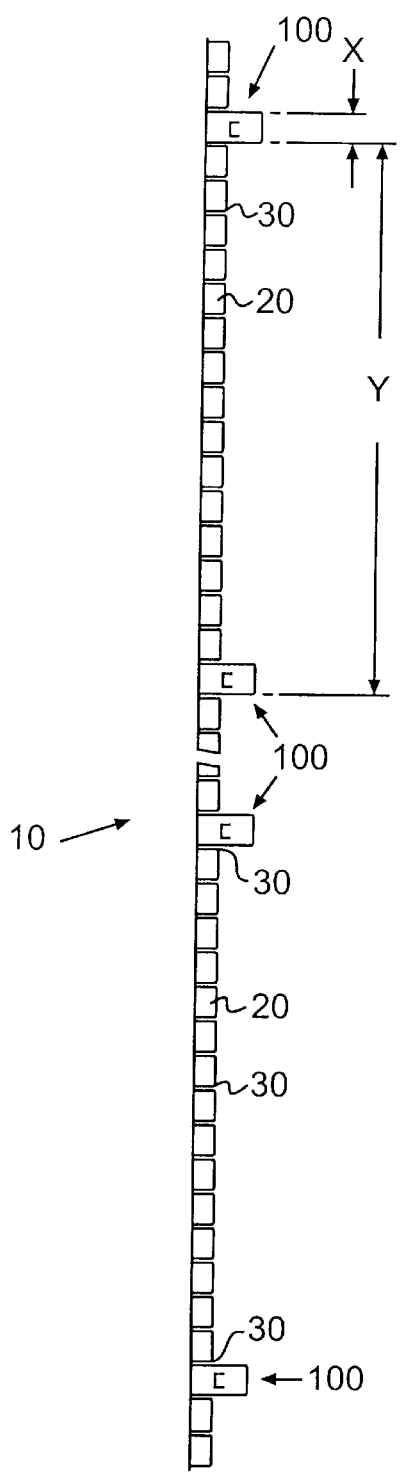
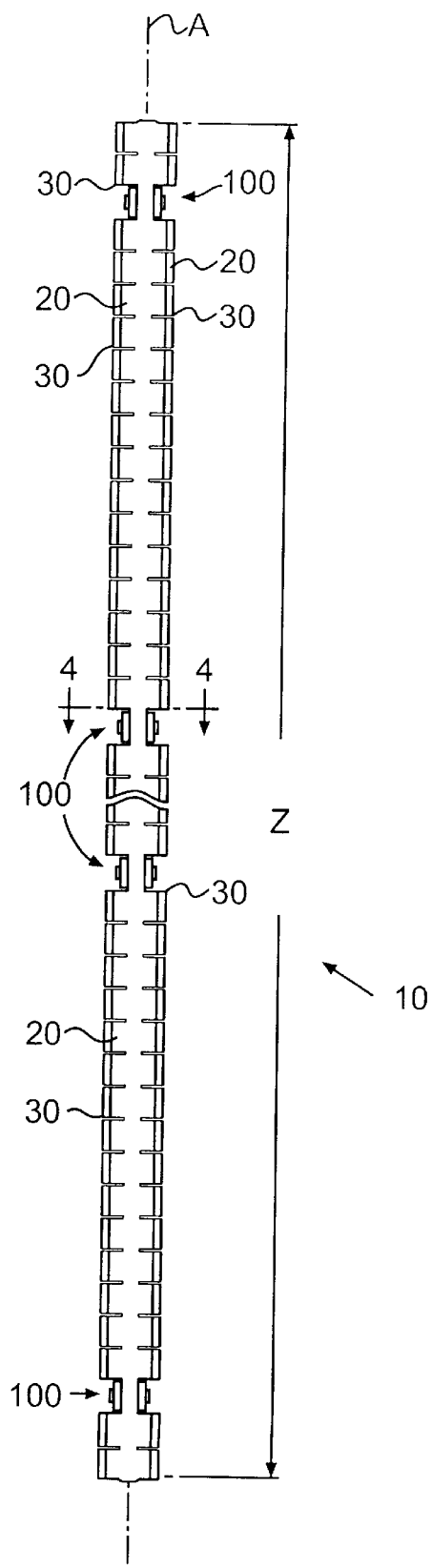
*FIG. 2*  *FIG. 3*

SHIELDING STRIP

BACKGROUND OF THE INVENTION

1. Field of the Invention

The present invention relates generally to electromagnetic interference (EMI)radio frequency interference (RFI) shielding devices, and more specifically, to a unitary locking EMI/RFI shielding strip.

2. Brief Description of the Related Art

Various types of EMI/RFI shielding devices are known for reducing the transmission of EMI and RFI. Among the known devices are gaskets or strips of a resiliently deformable material which are secured to an openable access panel, door, drawer, or the like (hereinafter "door"), to block the transmission of EMI/RFI through the small clearance between the door and the adjacent structure which forms the opening into and out of which the door is movable. Such strips are useful for shielding openings of housings for electronic components which are highly sensitive to the adverse effects of EMI/RFI.

Such known devices are typically made of one of several materials which have the combined functions of acting as an EMI/RFI shield, and which are resiliently deformable so that they can be compressed between the door when closed, and will spring back to art uncompressed configuration when the door is moved out of the opening.

Prior shielding strips, although providing an adequate level of shielding for the electronic devices, are often difficult to install on an electronics housing and are often not secured to a mounting surface to withstand the forces generated in use without detaching from the surface. For example, one prior strip utilizes a track which is riveted to the mounting surface of the housing, the shielding strip then being slid onto the riveted track to hold the strip in place. Although providing a secure mount for the shielding strip, the riveted track involves a relatively complicated installation procedure, involving several steps, and is therefore labor intensive. Furthermore, a shielding strip which requires a riveted track is relatively expensive, because it requires extra parts (a track and rivets), and added labor to install. The riveted track is also somewhat prone to misinstallation, because installation requires alignment of a rivet with holes in the track.

Another prior shielding strip utilizes an adhesive layer on a portion of the shielding strip which is intended to be mounted on the electronics housing. Although being relatively simple to install, adhesive shielding strips also suffer from particular deficiencies. Specifically, adhesive tends to not be as strong as the riveted track shielding strips, discussed above. If a stronger adhesive is used, the probability of mismounting the adhesive shielding strip increases, requiring destruction of the adhesive shielding strip in order to properly place an adhesive shielding strip on a mounting surface.

Yet another prior shielding strip utilizes one or two long, continuous slots cut into the mounting surface, into which portions of the shielding strip are inserted. If two slots are provided, then the shielding strip is partially expanded, and the entire length of the shielding strip is partially inserted into the slots. The shielding strip is not locked in place, however, and is prone to displacement out of the slots. While providing a good level of shielding when the slots are properly machined, the requirement that precisely machined slots be formed in the mounting surface makes this type of shielding strip more expensive, labor intensive, prone to mismounting, and leads to a heightened potential for EMI/RFI leakage though the slot and past the strip if the slots are machined too wide or long.

There therefore remains a need in the art to provide an inexpensive shielding strip which is easily installed on a mounting surface, which does not require precision machining of the mounting surface, and which locks the shielding strip in place.

SUMMARY OF THE INVENTION

According to a first exemplary embodiment of the invention, a shielding and/or grounding strip comprises a strip of material, the strip including at least one finger extending from the strip generally in a first direction, at least one snap lock extending from the strip generally in a second direction different from the first direction, the snap lock including at least one leg including at least one locking member extending at an angle from the at least one leg, wherein when the at least one leg is positioned in a hole through a mounting surface, the at least one finger is positioned on a first side of the mounting surface and the at least one locking member is positioned on a second side of the mounting surface opposite the first side of the mounting surface.

According to a second exemplary embodiment of the invention, a method of mounting a strip onto a mounting surface which is provided with an opening therein, the strip including a top portion, a finger extending from the top portion in a first direction, and a snap lock including a leg extending in a second direction different from the first direction, comprises the steps of inserting at least a portion of the leg into the hole, deflecting a locking portion of the leg away from an edge of the hole, and pushing the locking portion past the hole such that the locking portion snaps back in a direction toward and past the edge of the hole.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus, given only by way of example, and with reference to the accompanying drawings, in which:

FIG. 2 is a side view of the shielding strip illustrated in FIG. 1;

FIG. 3 is a bottom view of the shielding strip illustrated in FIG. 1;

DESCRIPTION OF THE PREFERRED EMBODIMENTS

Figure 1:
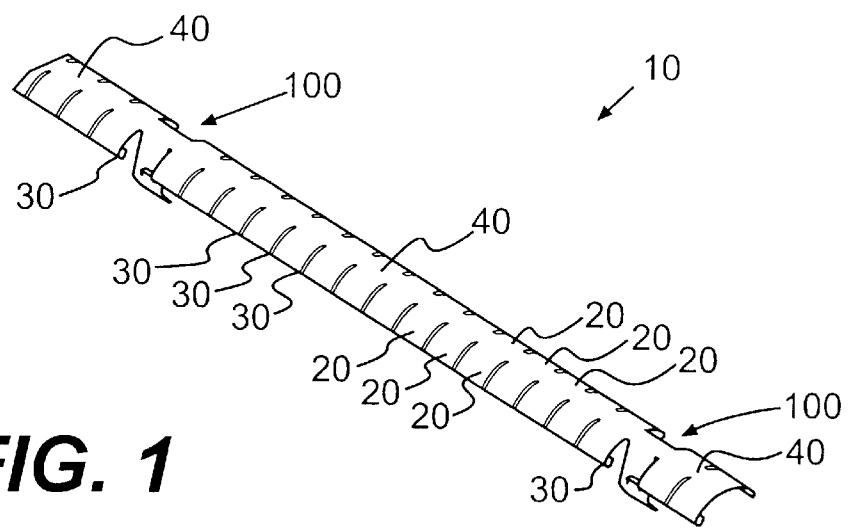
FIG. 1 is a top perspective view of a shielding strip according to the present invention.

Referring to the drawing figures, like reference numerals designate identical or corresponding elements throughout the several figures.

FIG. 1 illustrates a top perspective view of a shielding and/or grounding strip 10 in accordance with the present invention. Hereinafter, shielding and/or grounding strip 10 will be referred to as shielding strip 10; however, it is to be understood that shielding strip 10 may be used as a grounding strip as well.

Shielding strip 10 includes a plurality of fingers 20 along its length. Fingers 20 are separated by gaps or slots 30 which allow the fingers to flex outwardly and move independently, as will be described in greater detail below. Shielding strip 10 also includes a top section 40, through which there are no gaps or slots 30. Top section 40 provides a continuous length of material along the length of shielding strip 10 which gives added rigidity to the shielding strip. Solid top section 40 also allows for sliding motion against shielding strip 10 in directions both perpendicular and parallel to the length of the shielding strip, without snagging or damaging the gasket strip. Shielding strip 10 also includes at least one, and preferably a plurality of snap locks 100, located along the length of the shielding strip. Snap locks 100 are preferably spaced apart along the length of shielding strip 10 when there are a plurality of snap locks provided. Snap locks 100 hold shielding strip 10 in place on a mounting surface as will be described in greater detail below, and eliminate the need for extraneous and separate components to attach the shielding strip to a mounting surface.

Turning now to FIGS. 2 and 3, wherein FIG. 2 is a side view of shielding strip 10 and FIG. 3 is a bottom view thereof, shielding strip 10 is further illustrated. Snap locks 100, as illustrated in FIG. 2, preferably have a width X along axis A (see FIG. 3). Furthermore, when a plurality of snap locks 100 are provided along shielding strip 10, they are preferably separated by a distance Y along longitudinal axis A, i.e., Y represents the distance between respective portions of two snap locks 100. Turning now to FIG. 3, a shielding strip 10 is illustrated as having a total length Z along longitudinal axis A. Shielding strip 10 can, according to another embodiment of the present invention, be made continuously, for which there is no fixed length Z.

Shielding strip 10, including snap locks 100, preferably has a thickness S (see FIG. 4) of between about 0.002 inches (0.005 cm) and about 0.010 inches (0.025 cm), more preferably between about 0.003 inches (0.008 cm) and about 0.006 inches (0.015 cm), and most preferably between about 0.003 inches (0.008 cm) and about 0.004 inches (0.010 cm). As will be readily apparent to one of ordinary skill in the art, thickness S may be chosen to make shielding strip 10 more or less flexible, by selecting thickness S to be smaller or larger, respectively. As illustrated in FIG. 3, shielding strip 10 is preferably symmetrical about longitudinal axis A, i.e., portions of strip 10 on a first side of axis A are a mirror image of portions of the shielding strip on a second side of axis A opposite the first side. According to another embodiment of the present invention (not illustrated), shielding strip) 10 is not symmetrical about longitudinal axis A. According to this latter embodiment, fingers 20 may be of different lengths on different sides of longitudinal axis A, or fingers 20 may be entirely omitted from one side of strip 10. Furthermore, top section 40 can be partially or entirely to one side of longitudinal axis A.

Figure 5:
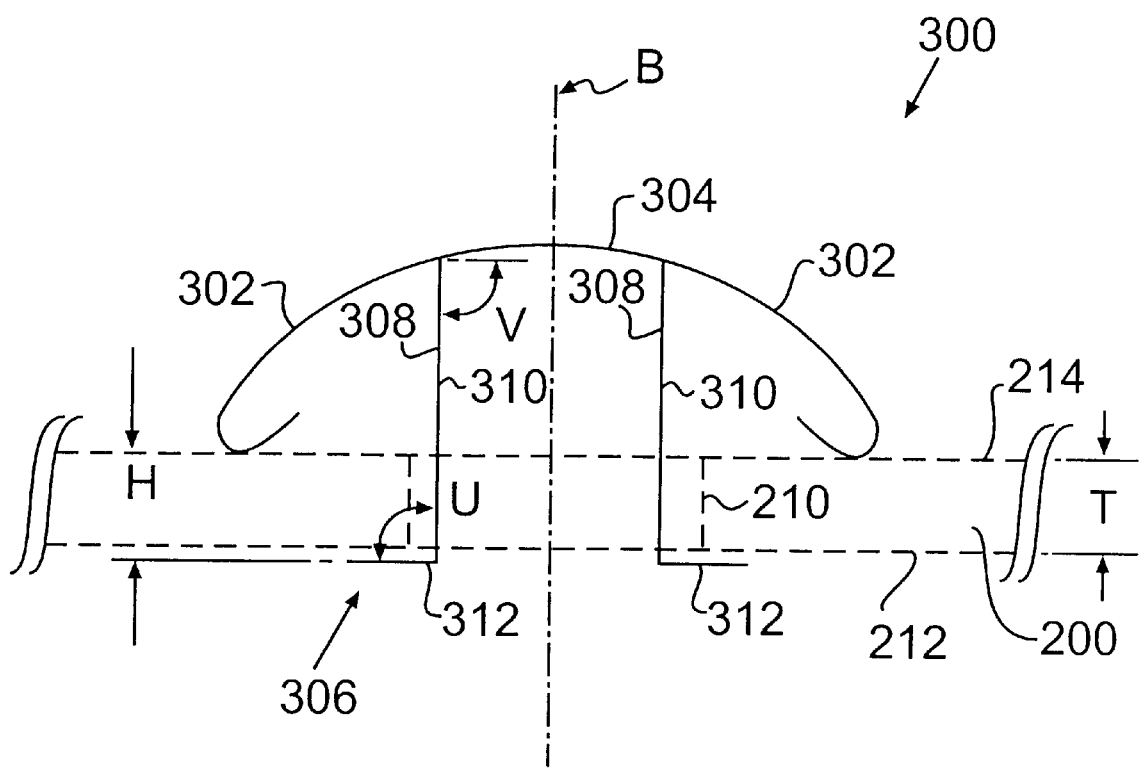
FIG. 5 illustrates a second embodiment of a shielding strip, viewed in section similar to the view illustrated in FIG. 4.

Shielding strip 10 is preferably formed of a springy, and more preferably, electrical conductive material. By the term springy it is meant that the material out of which shielding strip 10 is formed is elastic in nature, with a modulus of elasticity sufficient so that the shielding strip 10 and/or the fingers 20 can be displaced by a force from an unloaded position to a loaded position, and will return to the unloaded position upon the removal of this force, without exceeding the yield point of the material. By electrically conductive it is meant that the material out of which shielding strip 10 is constructed is capable of conducting electricity therethrough and has an impedance low enough that it is an effective EMI/RFI shield. The EMI/RFI shielding performance of one embodiment of a shielding strip 10, which is formed of a material which is both springy and conductive in accordance with the present invention, is illustrated in FIG. 5. However, other materials which are more or less springy and more or less conductive than that for which the data illustrated in FIG. 5 is representative, are still within the spirit and scope of the present invention. Preferably, the material out of which shielding strip 10 is formed is a beryllium copper alloy. A more preferable beryllium copper alloy is composed of between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). One suitable alloy is available from Brush Wellman, Cleveland, Ohio, as Brush Alloy 25 (copper alloy UNS number C1 7200).

Other suitable materials include phosphor bronze, copper-clad steel, brass, monel, aluminum, steel, stainless steel, nickel silver, and other BeCu alloys. Furthermore, the material can optionally be pre- or post-plated for galvanic compatibility with the surface on which it is intended to be mounted. Alternatively, the material can be a molded or cast polymer, preferably loaded or coated to be electrically conductive.

Figure 4:
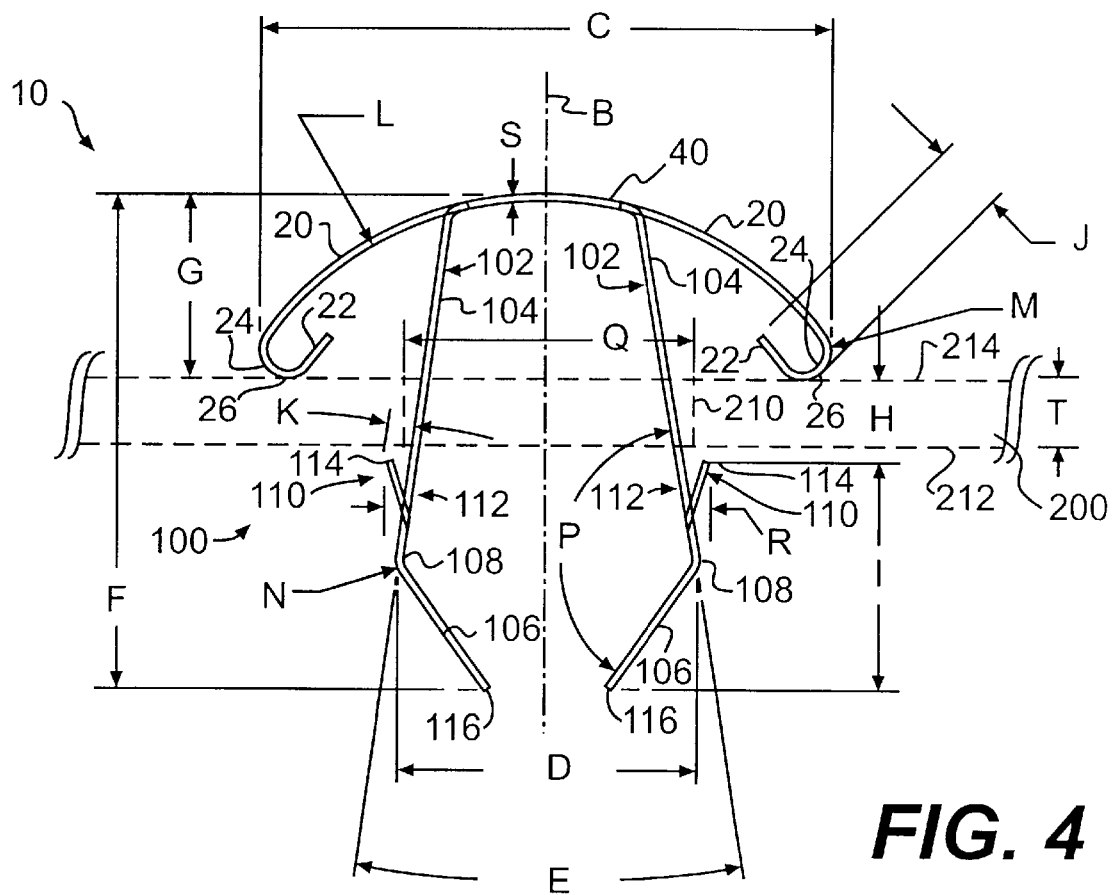
FIG. 4 is a sectional view taken at line 4—4 of the shielding strip illustrated in FIG. 3.

Turning now to FIG. 4, which illustrates a cross sectional view taken along line 4—4 in FIG. 3, one preferred embodiment of the present invention is presented in detail. Shielding strip 10 includes fingers 20 and a top portion 40. Snap lock 100 extends down from top portion 40. As discussed in greater detail above, shielding strip 10 may be symmetrical about longitudinal axis A. As illustrated in FIG. 4, shielding strip 10 may also be symmetrical about plane B, which includes axis A, in the same manner as described above with reference to axis A. In FIG. 4, a mounting surface 200 is illustrated in phantom for ease of visualization of the elements of shielding strip 10 illustrated therewith. Thus, as illustrated in FIG. 4, shielding strip 10 is illustrated after it has been mounted to mounting surface 200. Mounting surface 200 includes a mounting surface hole 210 which has a width Q and a depth (not labeled) along longitudinal axis A which is preferably greater than X (see FIG. 2).

Snap lock 100 includes one, and preferably two, legs 102 extending downward from top portion 40. Each leg 102 includes an upper portion 104 and a lower portion 106 which meet at a leg bend region 108. Extending from upper portion 104 of leg 102, snap lock 100 preferably includes a lance 110 which extends from the leg 102 in a direction generally toward finger 20 and/or top portion 40. Phrased differently, the angle formed between lance 110 and that portion of leg 102 from which the lance extends is preferably less than or equal to ($\leq$) 90 degrees (1.571 radians), i.e., is a right or acute angle. Lance 110 is preferably formed as a piece of material which is cut or stamped and bent out of leg 102, thus leaving a hole 112 in leg 102.

Lance 110 acts to lock the snap lock 100 onto the mounting surface 200, thereby locking shielding strip 10 to the mounting surface. For this purpose, the distance R between the ends 114 of the lances 110 perpendicular to plane B is preferably greater than the width Q of mounting surface hole 210. If it is desirable to construct shielding strip 10 with only one leg 102, the distance R corresponds to the distance K between the end 114 of lance 110 on the single existing leg and the upper portion 104 of the leg, in a direction perpendicular to that portion of leg 102 from which lance 110 extends.

According to an exemplary embodiment of the present invention, snap lock 100 includes two legs 102, as illustrated in FIG. 4, and has the specifications presented in Table 1. As will be readily appreciated by one of ordinary skill in the art, the specifications contained in Table 1 merely represent one exemplary embodiment of a shielding strip in accordance with the present invention, and furthermore that all of these dimensions can be changed to tailor the size and mechanical characteristics of the shielding strip and snap lock for other specific environments, without departing from the spirit and scope of the present invention.

TABLE 1

| Reference | English Units | SI Units |
| --- | --- | --- |
| C (length) | 0.349 inches | 0.886 cm |
| D (length) | 0.184 inches | 0.467 cm |
| E (angle) | 17.4 degrees | 0.304 radians |
| F (length) | 0.301 inches | 0.765 cm |
| G (length) | 0.110 inches | 0.279 cm |
| H (length) | 0.051 inches | 0.130 cm |
| I (length) | 0.140 inches | 0.356 cm |
| J (length) | 0.042 inches | 0.107 cm |
| K (length) | 0.017 inches | 0.043 cm |
| L (radius) | 0.212 inches | 0.538 cm |
| M (radius) | 0.015 inches | 0.038 cm |
| N (radius) | 0.020 inches | 0.051 cm |
| P (angle) | 135.9 degrees | 2.371 radians |

Fingers 20 preferably include a rolled over portion 24 which provides a bearing surface for each finger against the top 214 of mounting surface 200. Each finger 20 includes a rolled over portion 24 which connects a small end portion 22 to the remainder of each finger.

The length H between end 114 of lance 110 to the lowest point 26 of portion 24, taken in a direction parallel to plane B, is preferably related to thickness T of mounting surface 200. That is, when thickness T is larger, the distance between ends 114 of lances 110 and points 26 of portions 24 must be correspondingly larger; conversely, when thickness T is smaller, distance H may be made smaller. Preferably, distance H is selected to be slightly larger than thickness T of the mounting surface, so that when snap lock 100 is inserted into mounting surface hole 210, lances 110 can clear the bottom surface 212 of the mounting surface to bear against the bottom surface and thereby prevent the snap lock 100 and the shielding strip 10 from being pulled out of the mounting surface hole.

The function of the shielding strip 10 will now be described with reference to the drawing figures. When it is desired to mount a shielding strip 10 to a mounting surface 200 which includes at least one mounting surface hole 210, the shielding strip is positioned adjacent to the top 214 of the mounting surface with snap lock 100 positioned immediately adjacent to mounting surface hole 210. Ends 116 of legs 102 are then inserted into mounting surface hole 210, followed by lower portion 106 of leg 102. In the event that mounting surface hole 210 has a dimension Q which is smaller than dimension D illustrated in FIG. 4, shielding strip 10 is further pushed down into mounting surface hole 210 to cam lower portion 106 of leg 102 toward plane B, thus allowing the shielding strip and the snap lock to proceed into the mounting surface hole.

As snap lock 100 is further advanced into mounting surface hole 210, leg bend region 108 passes through the mounting surface hole, and legs 102 begin to return to their pre-stressed, unloaded position and move away from plane B. Thereafter, lance 110 passes through mounting surface hole 210 and is similarly bent toward plane B. As will be readily appreciated by one of ordinary skill in the art, when lance 110 is in contact with mounting surface hole 210, and is bent toward plane B, leg 102 will also be bent somewhat toward plane B. Thereafter, as snap lock 100 is further pushed through mounting surface hole 210, end 114 of lance 110 clears the bottom 212 of mounting surface 200, allowing lance 100 and the remainder of leg 102 to spring back away from plane B and past the edge of mounting surface hole 210. By thus springing back, lance 110, and particularly end 114 of lance 110, is positioned outside of mounting surface hole 210 to bear against the bottom surface 212 of mounting surface 200, to prevent retraction of the snap lock, and therefore the shielding strip 10, back through the mounting surface hole.

Shielding strip 10 is now ready to be used as a shielding and/or grounding strip, by contact with another surface (not illustrated) which would bear against fingers 20 and top section 40 with a force which has a component perpendicular to longitudinal axis A and in plane B. When shielding strip 10 is in use, fingers 20 and top portion 40 are borne against by another surface, which causes fingers 20 to flex along their length, thus bringing top surface 40 closer to mounting surface 200 and causing rolled over portions 24 to move away from plane B. During such use, lance 110 remains outside of mounting surface hole 210, thereby ensuring that shielding strip 10 will not be displaced from the mounting surface. When the loading surface is removed from being in contact with shielding strip 10, the resilient nature of the material out of which shielding strip 10, and particularly fingers 20, is constructed causes fingers 20 to return to their unloaded position, illustrated in FIG. 4. The material out of which shielding strip 10 and snap lock 100 are constructed is selected so that during insertion of snap lock 100 into mounting surface hole 210 and in the use of shielding strip 10 as a shielding and/or grounding strip, the yield point of the material is not reached, i.e., no plastic deformation of the material occurs.

FIG. 5 illustrates a second embodiment 300 of a shielding strip according to the present invention. Shielding strip 300 is similar in some respects to shielding strip 10 in construction and function. Shielding strip 300 includes fingers 302 similar to fingers 20, a top portion 304 similar to top portion 40, and a snap lock 306 somewhat similar to snap lock 100. FIG. 5 illustrates shielding strip 300 mounted on a mounting surface 200 in a mounting surface hole 210, with fingers 302 resting on a top surface 214 of the mounting surface and portions of snap lock 306 positioned below bottom surface 212 of the mounting surface to lock the shielding strip in place. Snap lock 306 includes at least one, and preferably two, legs 308 which each include an upper portion 310 and a lower portion 312. Legs 308 can be in the same plane, or can be offset from one another along the length of the strip, such that both legs 308 can be deflected past plane B without interfering with one another.

When only one leg 308 is provided on snap lock 306, the length of leg lower portion 312 is selected to be greater than the width Q of hole 210. Leg lower portion 312 functions to lock shielding strip 300 onto mounting surface 200, in a manner similar to lance 110 in the embodiment illustrated in FIG. 4. Also similar to the embodiment illustrated in FIG. 4, distance H is preferably selected to be somewhat greater than thickness T of mounting surface 200, for the reasons stated above.

Upper leg portion 310 is illustrated as being approximately parallel to plane B, i.e., the upper leg portion forms an angle V with a plane perpendicular to plane B, which angle V is roughly a 90 degree (1.571 radians) angle. Alternatively, angle V can be greater or less than 90 degrees, such that legs 308 are angled away from or toward plane B, respectively. Leg lower portion 312 forms an included angle U with leg upper portion 310. In the embodiment illustrated in FIG. 5, U is approximately 90 degrees. Angle U may be alternatively greater or less than 90 degrees without departing from the spirit and scope of the invention. Selecting an angle U less than 90 degrees aids in insertion of shielding strip 300 in mounting surface hole 210, as will be readily appreciated by one of ordinary skill in the art.

To mount shielding strip 300 to mounting surface 200, legs 308 are pushed together (toward plane B) so that leg lower portions 312 can be inserted into mounting surface hole 210. Once inserted into hole 210, shielding strip 300 is pushed down until leg lower portions 312 are past bottom surface 212, at which point legs 308 snap apart. Because leg lower portions 312 extend past hole 210, shielding strip 300 is locked in place. Shielding strip 300 is then ready to use in the same manner as shielding strip 10.

Figure 6:
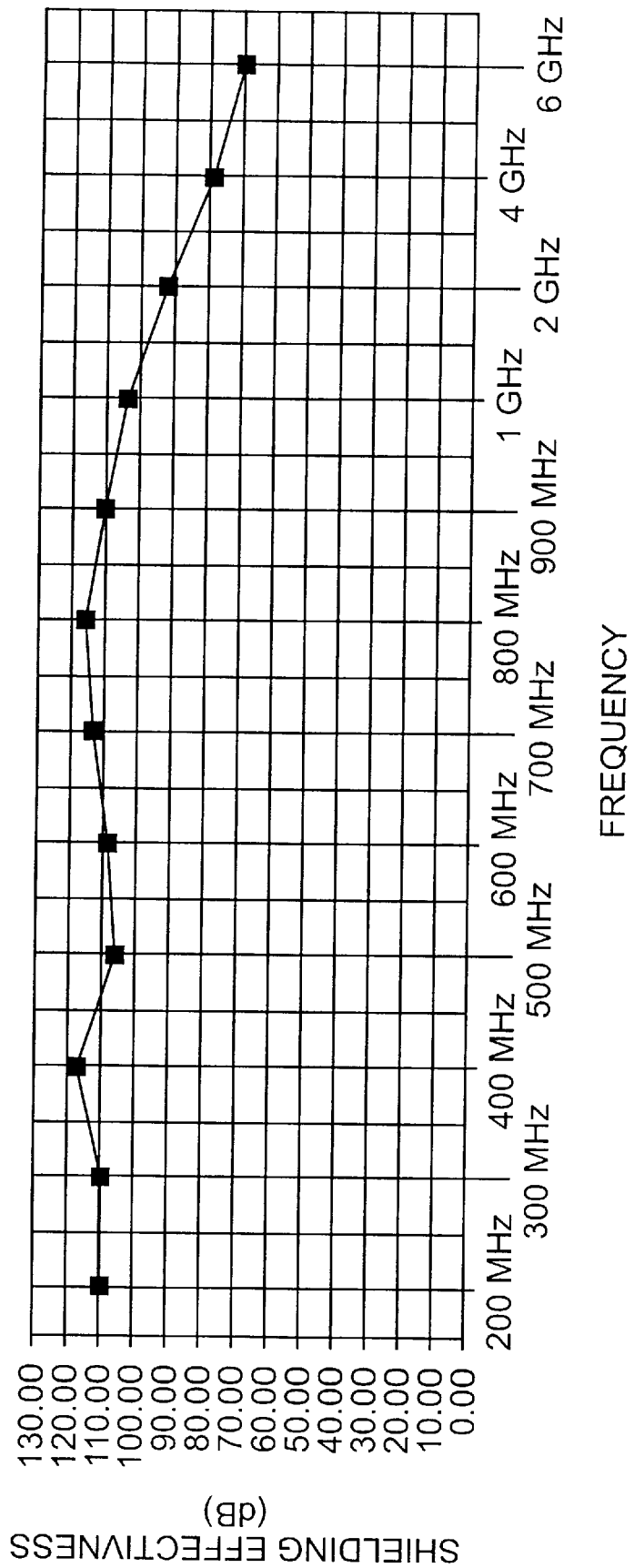
FIG. 6 is an illustration of a chart of data points of the shielding effectiveness versus the incident frequency of radiated energy for a shielding strip in accordance with the present invention.

FIG. 6 illustrates a chart of data points of the shielding effectiveness versus frequency of incident radiated energy for a shielding strip 10 according to the present invention, tested in accordance with Mil. Spec. Mil G 83528.

While the invention has been described in detail with reference to preferred embodiments thereof, it will be apparent to one skilled in the art that various changes can be made, and equivalents employed, without departing from the scope of the invention.

What is claimed is:

1. A shielding and/or grounding strip comprising a strip of material, said strip including:

an upper strip element including a substantially continuous, central top portion;

a plurality of fingers extending from said continuous top surface generally in a first direction;

at least one snap lock extending from said continuous top surface generally in a second direction different from said first direction, said snap lock including at least one leg having at least one locking member extending at an angle from said at least one leg, said at least one snap lock being disposed along said continuous top surface between adjacent said pairs of fingers;

wherein said at least one leg is configured to be positioned in a hole through a mounting surface, said plurality of fingers are configured to be positioned on a first side of said mounting surface and said at least one locking member being configured to be positioned on a second side of said mounting surface opposite said first side of said mounting surface;

wherein said at least one leg of said at least one snap lock comprises an upper portion connected to said strip top portion and a lower portion connected to said leg upper portion opposite said strip top portion, said leg upper portion and said leg lower portion forming a leg angle therebetween;

wherein said leg upper portion comprises a lance extending therefrom in a direction away from said leg lower portion; and wherein said at least one leg comprises two legs connected to said top portion, said two legs being mirror images of each other, and wherein said lances of said legs extend generally away from each other.

2. A method of mounting a strip onto a mounting surface, the mounting surface provided with an opening therein, the strip including an upper strip portion having a continuous central top surface, a plurality of pairs of fingers extending from each top surface, one of the fingers of said pair of fingers extending in a first direction substantially opposite from the direction of the other finger of each pair, of fingers and a snap lock including a leg, said snap lock extending from the top surface in a second direction different from said first direction, and said snap lock being positioned between adjacent said fingers, said method comprising the steps of:

inserting at least a portion of said leg into said hole;

deflecting a locking portion of said leg away from an edge of said hole;

pushing said locking portion past said hole such that said locking portion snaps back in a direction toward and past said edge of said hole.

3. A shielding and/or grounding strip comprising a strip of material, said strip including:

an upper strip element including a substantially continuous, central top portion;

a plurality of pairs of fingers extending from said continuous top portion, one of the fingers of each pair of fingers extending from said top portion in a first direction, substantially opposite from the direction of the other finger of each pair of fingers;

at least one snap lock extending from said continuous top portion generally in a second direction different from said first direction, said snap lock including at least one leg having at least one locking member extending at an angle from said at least one leg, said at least one snap lock being disposed along said continuous top portion between adjacent said pairs of fingers;

wherein said at least one leg is configured to be positioned in a hole through a mounting surface, said plurality of fingers are configured to be positioned on a first side of said mounting surface and said at least one locking member being configured to be positioned on a second side of said mounting surface opposite said first side of said mounting surface.

4. A strip in accordance which claim 3, wherein said at least one locking member comprises at least one lance extending from said at least one leg.

5. A strip in accordance with claim 4, wherein said angle is less than 90 degrees.

6. A strip in accordance with claim 3, comprising two pairs of fingers, each finger of each pair extending from said top portion in substantially opposite directions from the other finger of each pair, said at least one snap lock positioned between said two pairs of fingers.

7. A strip in accordance with claim 3, wherein said at least one leg of said at least one snap lock comprises an upper portion connected to said strip top portion and a lower portion connected to said leg upper portion opposite said strip top portion, said leg upper portion and said leg lower portion forming a leg angle therebetween.

8. A strip in accordance with claim 7, wherein said leg angle is greater than 90 degrees.

9. A strip in accordance with claim 7, wherein said leg angle is less than 90 degrees.

10. A strip in accordance with claim 7, wherein said leg upper portion comprises a lance extending therefrom in a direction away from said leg lower portion.

11. A strip in accordance with claim 10, wherein said at least one leg comprises two legs connected to said top portion, said two legs being mirror images of each other, and wherein said lances of said legs extend generally away from each other.

12. A strip in accordance with claim 11, wherein said two legs are offset from each other along the length of said strip.

13. A strip in accordance with claim 3, wherein said at least one leg comprises two legs connected to said top portion, said two legs being mirror images of each other.

14. A strip in accordance with claim 13, wherein each of said legs consists essentially of an upper leg portion and a lower leg portion, said lower leg portions extending away from each other.

15. A strip in accordance with claim 13, wherein lower leg portions extend generally toward each other.

16. A strip in accordance with claim 3, wherein said strip is formed of a material selected from the group consisting of a beryllium copper alloy, phosphor bronze, copper-clad steel, brass, monel, aluminum, steel, stainless steel, nickel silver, and polymer.

\* \* \* \* \*